United States Patent [19]
Blaum et al.

[11] Patent Number: 5,644,695
[45] Date of Patent: Jul. 1, 1997

[54] ARRAY COMBINATORIAL DECODING WITH MULTIPLE ERROR AND ERASURE DETECTION AND LOCATION USING CYCLIC EQUIVALENCE TESTING

[75] Inventors: Mario Blaum, San Jose, Calif.; Alexander Vardy, Champaign, Ill.

[73] Assignee: International Business Machines Corporation, Armonk, N.Y.

[21] Appl. No.: 276,074

[22] Filed: Jul. 15, 1994

Related U.S. Application Data

[63] Continuation-in-part of Ser. No. 177,633, Jan. 3, 1994, Pat. No. 5,351,246.

[51] Int. Cl.$^6$ ................................................. G06F 11/34
[52] U.S. Cl. ........................... 395/182.04; 395/182.05; 371/37.7; 371/49.1
[58] Field of Search ........................ 395/575, 182.04, 395/185.01; 371/10.1, 68.3, 54, 50.1, 49, 48, 37.4, 37.7, 38, 39

[56] References Cited

U.S. PATENT DOCUMENTS

| | | | |
|---|---|---|---|
| 3,755,779 | 8/1973 | Price | 340/146.1 AL |
| 4,494,234 | 1/1985 | Patel | 371/38 |
| 4,796,260 | 1/1989 | Schilling et al. | 371/39 |
| 5,271,012 | 12/1993 | Blaum et al. | 371/101 |

OTHER PUBLICATIONS

"Shift Register synthesis and BCH Decoding", IEEE Transactions on Information Theory, vol. IT–15, pp. 123–127, copyright 1969.

*Primary Examiner*—Phung Chung
*Attorney, Agent, or Firm*—R. Bruce Brodie; Paik Saber

[57] ABSTRACT

An apparatus and method for detecting and locating up to two symbols in error or erasures in an n×m A(n,m,t) parity coded bit array previously recorded on a multi-track storage device where n is a prime number, m≦n, wherein at least one non-zero syndrome of m rotated and column summed syndromes is derived. The method includes an iterative process using an incremented tracking variable and testing of the cyclic equivalence of three derived vectors to isolate the number and location of the array column or columns containing the error or errors. Each derived vector is the modulo 2 sum of a selected syndrome and a selected rotated vector. Cyclic equivalence of between a derived vector and a selected rotated one of the other derived vectors for any given iteration establishes the error or errors and their column location or locations. An extension is shown for detecting and locating up to three errors or erasures. Correction of the errors involves parity recoding the array following parity traverses of different slopes.

9 Claims, 9 Drawing Sheets

FLOW OF CONTROL FOR CORRECTING TWO ERRORS INCLUDING TESTING FOR CYCLIC EQUIVALENTS

DASD STORAGE SUBSYSTEM WITH ARRAY
ECC UNITS SELECTIVELY POSITIONED

STORAGE CONTROL BUFFER WITH DATA ARRAY
BUFFER AND LOCAL APL PROCESSOR

ENCODING & REBUILDING AN ARRAY OF DASDS STORING DATA BLOCKS

|   | 0 | 1 | 2 | 3 | 4 |
|---|---|---|---|---|---|
| 0 | A | A | A | A | A |
| 1 | B | B | B | B | B |
| 2 | C | C | C | C | C |
| 3 | D | D | D | D | D |
| 4 | E | E | E | E | E |

TRAVERSE OF SLOPE = 0 FOR PARITY ENCODING OF A DATA ARRAY

FIG. 1D

|   | 0 | 1 | 2 | 3 | 4 |
|---|---|---|---|---|---|
| 0 | A | B | C | D | E |
| 1 | B | C | D | E | A |
| 2 | C | D | E | A | B |
| 3 | D | E | A | B | C |
| 4 | E | A | B | C | D |

TRAVERSE OF SLOPE = 1 FOR PARITY ENCODING OF A DATA ARRAY

FIG. 1E

|   | 0 | 1 | 2 | 3 | 4 |
|---|---|---|---|---|---|
| 0 | A | C | E | B | D |
| 1 | B | D | A | C | E |
| 2 | C | E | B | D | A |
| 3 | D | A | C | E | B |
| 4 | E | B | D | A | C |

TRAVERSE OF SLOPE = 2 FOR PARITY ENCODING OF A DATA ARRAY

FIG. 1F

FLOW OF CONTROL FOR CORRECTING TWO ERRORS
INCLUDING TESTING FOR CYCLIC EQUIVALENTS

```
[0]   ∇ ← DEC2 V;N;B;X;S0;S1;S2;S3;K;L;Y1;Y2;Y3;R1;R2;T
[1]   A THIS FUNCTION CORRECTS UP TO TWO ERRORS IN AN ARRAY CODE,
[2]   A THE INPUT IS GIVEN IN THREE DIFFERENT FORMS: IN VECTOR FORM,
[3]   A WITH LENGTH B(B+1), WHERE B IS THE LENGTH OF A BYTE; AS A
[4]   A BX (B+1) MATRIX, WITH THE LAST ROW BEING THE 0-ROW,
[5]   A IN ALL CASES, THE OUTPUT IS GIVEN IN THE SAME FORMAT
[6]   A AS THE INPUT
[7]   A
[8]   T ← ppV
[9]     → (T=1)/G01
[10]    → ((pV)[1]=(pV)[2])/YEP
[11]  B ← (pV)[1]
[12]  X ← V
[13]    → NINE
[14]  YEP:B ← ⁻1+(pV)[1]
[15]  X ← V
[16]    → G02
[17]  G01:N ← pV
[18]  B ← ((⁻1)+(1+4xN)*0.5)÷2
[19]  X ← ⊖((B+1),B)pV
[20]  NINE:X ← X,[1](B+1)p0
[21]  G02:S0 ← 0 SYN X
[22]  S1 ← 1 SYN X
[23]  S2 ← 2 SYN X
[24]  S3 ← 3 SYN X
[25]  A0 ← S0
[26]  A0 ← S1
[27]  A0 ← S2
[28]  A0 ← S3
[29]  L ← B
[30]  Y1 ← 2|S1+(0-L) φ S0
[31]  Y2 ← S|S2+(0-2xL) φ S0
[32]  Y3 ← 2|S3+(0-3xL) φ S0
[33]  A0 ← Y1
[34]  A0 ← Y2
[35]  A0 ← Y3
[36]    → (0≠(v/Y1)v(v/Y2)vv/Y3)/MOVE1
[37]  X[;L+1] ← 2|X[;L+1]+S0
[38]    → OUT1
[39]  MOVE1:AX ← X,[1](B+1)p0
[40]  A0 ← pX
```

APL FLOW OF CONTROL FOR CORRECTION OF MULTIPLE ERASURES AND ERRORS IN AN A(n,m,t) CODED DATA USING CYCLIC EQUIVALENT TESTS

FIG. 2A

```
[41]  K ← 1
[42]  L ← 0
[43]  LOOP:Y1 ← 2|S1+(0-L) φ S0
[44]  Y2 ← 2|S2+(0-2xL) φ S0
[45]  Y3 ← 2|S3+(0-3xL) φ S0
[46]  → (0≠(v/Y1)v(v/Y2)vv/Y3)MOVE
[47]  X ← [ ;L+1] ← 2|X[ ;L+1]+S0
[48]  → OUT1
[49]  MOVE:R1 ← 2|((0-K) φ Y1)+(0-L) φ Y1
[50]  → (1= ∧/R1=Y2)/NEXT
[51]  BACK1:L ← L+1
[52]  → (L=K)/G0
[53]  → LOOP
[54]  G0:K ← K+1
[55]  A0 ← K
[56]  → (K>B)/EXIT
[57]  L ← 0
[58]  → LOOP
[59]  NEXT:R2 ← 2|((0+K+L) ⊖ Y1)=((0-K) φ Y2)+(0-L) φ Y2
[60]  → (1= ∧/R2=R3)/PUSH
[61]  → BACK1
[62]  PUSH:X[⍳B;(L+1),K+1] ← (B,2)ρ0
[63]  A0 ← X
[64]  A0 ← L
[65]  A0 ← K
[66]  AX ← (L,K)DECODE X,[1](ρV)[2]ρ0
[67]  X ← (L,K)DECODE X
[68]  OUT1: → (T=1)/OUT
[69]  Z ← X
[70]  → ((ρV)[1]=(ρV)[2]/END
[71]  Z ← X[⍳B;]
[72]  → END
[73]  EXIT:Z ← 'UNCORRECTABLE ERROR'
[74]  → END
[75]  OUT:Z ← ⊖X[⍳B;]
[76]  END:
```

APL FLOW OF CONTROL (CONT'D) FOR CORRECTION OF MULTIPLE ERASURES AND ERRORS IN AN A(n,m,t) CODED DATA USING CYCLIC EQUIVALENT TESTS

FIG. 2B

```
[0]  Z ← L SYM A;P;C; □IO
[1]  A CALCULATION OF THE LTH SYNDROME
[2]  A
[3]  □IO ← 0
[4]  P ← (ρA)[1]
[5]  C ← Lx(0+(ιP))
[6]  A ← C φ [0]A
[7]  Z ← 2|+/A
```

```
[0]   Z ← P G01 V; □IO;K1;K2
[1]   □IO ← 0
[2]   K1 ← V[0]
[3]   K2 ← V[1]
[4]   Z ← 6 ρ 0
[5]   Z[0] ← P|0
[6]   Z[1] ← P|K1
[7]   Z[2] ← P|2xK2-K1
[8]   Z[3] ← P|(3xK2)-2xK1
[9]   Z[4] ← P|(2xK2)+K1
[10]  Z[5] ← P|3xK2
```

FLOW OF CONTROL FOR SYNDROME COMPUTATION
CALLED BY THE MAIN APL PROCESS OF FIGS 2A & B

FIG. 3

```
[0]   Z←A SHILOAH B;L;M;H;N;⎕IO
[1]   A THIS FUNCTION IMPLEMENTS THE SHILOAH ALGORITHYM, GIVEN 2 VECTORS
[2]   A A AND B, IT DETERMINES THE NUMBER OF ROTATION POSITIONS OF A IN
[3]   A ORDER TO OBTAIN B
[4]   ⎕IO← 0
[5]   L← 0
[6]   M← 0
[7]   H← 0
[8]   N← ρA
[9]   LOOP: →(A[N|L+H]≠B[N|M+H])/MOVE
[10]  H← H+1
[11]  →(H<N)/LOOP
[12]  →OUT
[13]  MOVE: →(A[N|L+H]>B[N|M+H])/JUMP
[14]  M← M+H+1
[15]  →(M≥N)/OUT
[16]  H← 0
[17]  →LOOP
[18]  JUMP:L← L+H+1
[19]  →(L≥N)/OUT
[20]  H← 0
[21]  →LOOP
[22]  OUT: →H≠N)/GO
[23]  Z← N|M-L
[24]  →END
[25]  GO:Z← N
[26]  END:
```

AN ALTERNATIVE APL DEFINED FUNCTION FOR ROTATION OF TWO VECTORS AS USED IN TESTING FOR CYCLIC EQUIVALENTS

FIG. 4

ARRAY COMBINATORIAL DECODING WITH MULTIPLE ERROR AND ERASURE DETECTION AND LOCATION USING CYCLIC EQUIVALENCE TESTING

RELATED U.S. APPLICATIONS

This application is a continuation in part of the Blaum et. al., U.S. Ser. No.:08/177,633, filed Jan 3, 1994 and now U.S. Pat. No. 5,351,246.

FIELD OF THE INVENTION

This invention relates to a method and means for detecting and correcting multiple errors and erasures occurring when reading parity coded (M−1)×M data arrays using combinatorial rather than finite field operations, said data arrays having been made available from a communications subsystem or previously recorded on multi-tracked magnetic or optical storage subsystems.

DESCRIPTION OF RELATED ART

It is known that strings of data symbols written to and read from cyclic, multi-tracked magnetic, optical or equivalent storage media are subject to random or systematic error or erasure. It is further known to mix a sequence of data symbols with checking symbols from a suitably designed error correcting code to form a codeword of multiple symbols in length and to write the codeword on a recording track extent (a sector or fraction thereof). Conceptually, this is similar to dividing a block of data symbols of some fixed number by an algebraic structure that possesses properties of the error correction code and appending any remainder of the division operation to the data block. The resulting code word includes data symbols+redundant symbols. In the case of linear block codes, the structure is in the form of a generating code matrix. In the case of linear cyclic codes, the structure is in the form of a rational polynomial defined over a finite field.

The recorded codeword is read back from the storage medium on an opportunistic or scheduled basis. As part of this readback process, the codeword is tested on the fly by dividing it by the algebraic structure. If the remainder of the division operation is zero, the codeword is deemed to be without error. The checking symbols may be removed so that the data block may be utilized by any application executing on a CPU accessing the data. However, a non-zero remainder is indicative of error or erasure and additional correction processing is required. Where the number of symbols in error or erasure are within the correction capacity of the code, then correction can be immediately performed usually by hardware means.

Where the errors or erasures exceed the correction capability of the code, then failure is reported to the storage subsystem control unit. The control unit can ignore the error, repeat the correction attempt, and/or treat the failure as an indication that the storage device is in a degraded or failed mode.

Linear Block Codes

A linear block code C is formed from a set of codewords of length n defined over an alphabet and having the property of closure under addition and multiplication of any pair of the codewords. The capacity of the code to detect and correct errors is related to the minimum distance among the codewords. The distance is the number of symbol differences between any pair of words. As a general proposition, in order to correct t<n errors, the codewords must be separated by a distance of at least 2t+1 symbols from each other.

Linear Cyclic Codes

A code C is said to be a linear cyclic code if the cycle shift of each codeword is also a codeword. If each codeword u in C is of length n, then the cyclic shift $\pi(u)$ of u is the word of length n obtained from u by shifting the last digit of u and moving it to the beginning, all other digits moving i position to the right.

Reed Solomon Codes

Reed Solomon (RS) codes are among the most extensively used error correcting codes since they maintain the maximum distance among codewords for a given length n. An RS code uses a generating polynomial over a finite (Galois) field having a multiple symbol alphabet of codewords whose recording length is that of a sector or a portion of a track sector. In RS codes several errors can be isolated by ensuring that any given codeword is divisible by a number of different first order polynomials. Thus, in order to correct for t errors, then a codeword must be divisible by 2t polynomials of the form $(x+a^i)$ where i lies in the range $1 \leq i \leq 2t$ and a=primitive element in a Galois field.

Array Codes

A data array is a two dimensional data construct laid out in a rectangle and formed by rows and columns. Error correcting codes for data arrays naturally take advantage of the array geometry and properties. Array encoding, unlike Reed Solomon encoding, employs simple logic operations such as cycle shifts and bitwise exclusive OR operations as opposed to the operations of multiplication and division over finite fields. Array codes find use in managing multiple errors and erasures in multitracked storage subsystems in a manner similar to Reed Solomon.

Array codes are described in Blaum et. al., U.S. Pat. No. 5,271,012, "Method And Means For Encoding And Rebuilding Data Contents Of Up To Two Unavailable DASDs In An Array Of DASDs", issued Dec. 14, 1993. In data array encoding, data is mapped into an (n−1)*n data array where n is a prime number. Pairs of simple parities are recursively encoded over data in respective diagonal major and intersecting row major order array directions. In this regard, the encoding traverse covers a topologically cylindrical path. Rebuilding data upon unavailability of up to two symbols or blocks in the array as by error or erasure merely requires repeating the encoding step where the diagonals are oppositely sloped.

In the copending Blaum '633 application, a method and means for encoding an (n−1)×n data array written onto an array of n synchronous recording paths are disclosed. Also, steps are set out for rebuilding and writing onto spare recording path capacity when up to a preselected number R of array DASDs fail, or one DASD becomes erroneous and up to R−2 fail. Data is mapped into the parallel paths using an (n−1)×n data and parity block array as the storage model where n is a prime number and each block extent is uniform and at least one bit in length.

In the '633 application, the (n−1)×n data and parity block array is encoded to include zero XOR sums along a traverses of slopes 0, 1, 2, . . . P−1, extended cyclically over said data array. Rebuilding data and parity blocks is occasioned upon unavailability of no more than R ≤ P recording path failures, or one recording path in error and up to R−2 recording path failures. This includes calculating XOR–sums along the traversed paths of P−1 slopes, cyclic and linear shifts and XOR operations, recovering the unavailable DASDs by means of iterative solution of a set of recursions, and finally writing the rebuilt array back to onto n recording paths inclusive of any spare paths.

One shortcoming of the array decoders as to be found in the copending Blaum '633 application is that decoding and correction of multiple errors or erasures requires the operations of multiplication and division over a finite field. These require devices of high complexity as expressed in the Berlekamp-Massey decoder described in J. L. Massey, "Shift Register Synthesis And BCH Codes", IEEE Transactions on Information Theory, vol. IT-15, pp.122–127, copyright 1969. In this sense, an array decoder implemented according to this art would approximate the same complexity as that of a Reed-Solomon decoder negating some of the implementation advantage of array code rather RS code usage.

SUMMARY OF THE INVENTION

It is an object of this invention to devise a method and means for decoding and correcting multiple data errors or erasures using array parity codes without resort to finite field operations. That is, the detection and correction of error and erasure does not rely on the algebraic structure of the codes but on their combinatorial properties.

It is a related object that such an array decoding and error correction method and means be utilized in conjunction with correcting up to three tracks in error in multi-tracked magnetic and optical recording medium including magnetic and optical tape storage subsystems, and parity coded and striped RAID DASD arrays.

The above objects are satisfied by an array decoding method and means in which only the operations of cyclic rotations, bitwise XORing across columns of the array, and testing for cyclic equivalence among binary vectors are required.

More particularly, the invention embodies a method and means for detecting and locating up to two symbols in error or erasures in an track storage device where n is a prime number, $m \leq n$. In the presence of error, at least one non-zero syndrome of m rotated and column summed syndromes is derived from the array.

The method further includes an iterative process using an incremented tracking variable and testing of the cyclic equivalence of three derived vectors to isolate the number and location of the array column or columns containing the error or errors. Each derived vector is the modulo 2 sum of a selected syndrome and a selected rotated syndrome. Cyclic equivalence between a derived vector and a selected rotated one of the other derived vectors for any given iteration establishes the error or errors and their column location or locations. In this regard, cyclic equivalence means that for some integer k, a vector a' is the same as vector b' if rotated by k positions. An extension is shown for detecting and locating up to three errors or erasures. Lastly, correction of the errors involves parity recoding of the array following traverses of different slopes.

BRIEF DESCRIPTION OF THE DRAWING

FIGS. 1D–1F exhibits a data array in which different parities are defined by a traverse of data over counterpart slopes of 0, 1, and 2.

FIGS. 2A–2B sets out a flow of control expressed as APL defined functions for correction of multiple erasures and errors in a parity coded data array using cyclic equivalents embodying the precepts depicted in FIG. 1F.

FIG. 3 exhibits the flow of control as APL defined functions for syndrome computation called by the process depicted in FIGS. 2A and 2B.

FIG. 4 shows the flow of control of an alternative APL defined function for rotating two vectors used in testing for cyclic equivalents.

DESCRIPTION OF THE PREFERRED EMBODIMENT

A Storage Subsystem of Multi-Tracked Devices, Fault Tolerance and Data Arrays

Figure 1A:
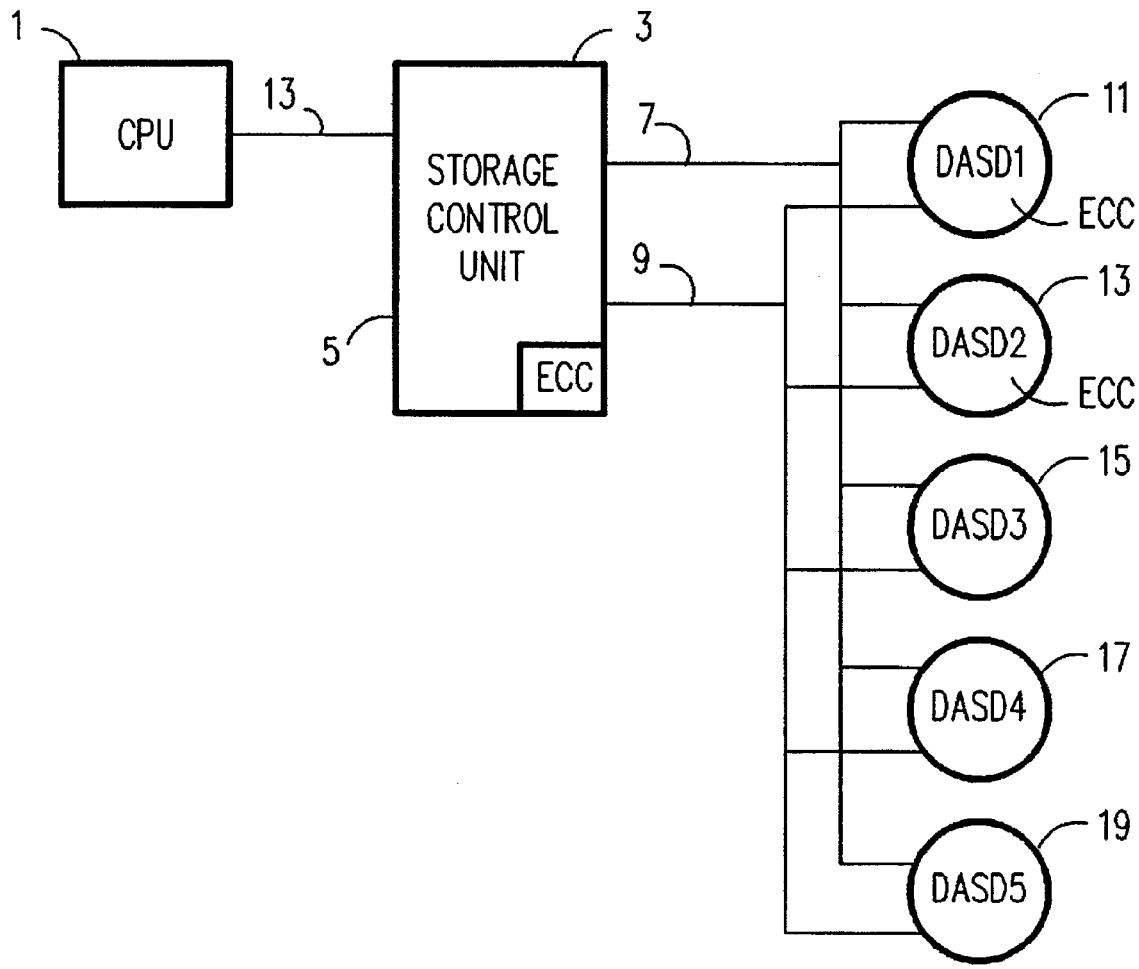
FIG. 1A illustrates a multi tracked storage subsystem attaching a CPU and the positioning of error correction code (ECC) functions within the subsystem.

Referring now to FIG. 1A, there is shown a plurality of direct access storage devices (DASDs) 11, 13, 15, 17, and 19. Each DASD includes one or more cyclic multi-tracked magnetic recording media with an independently actuable read/write transducers (not shown) positionable over selected track addresses. A host computer CPU 1 transmits access commands over path 13 to storage control unit (SCU) 3. These commands are interpreted by the SCU. The CPU responsively sends control signals to selective ones or all of the DASDs 11–19 over control path 9. The control signals in turn cause the transducer's to be positioned over the track addresses specified in the access commands. Once the transducers are positioned, then data in the form of bit strings of coded symbols is streamed from selected ones of the DASDs over data path 7 to SCU 3 to CPU 1 over path 13 for a READ access and in the oppositely poled direction to the DASDs for a WRITE access from the CPU 1.

Data arrays can be mapped onto different configurations of storage devices. One configuration as discussed in the Blaum references is that of a synchronous DASD array of the RAID 3 type. The array columns may be thought of as consecutive positions along a counterpart tracks in each of the DASD arrays. An array also may be mapped onto a single storage device such as a multi-tracked tape. In both instances, array codes find use in correcting errors or erasures detected when reading a previously stored data array back from the multi track storage subsystem.

Referring again to FIG. 1A, it should also be appreciated that storage subsystems provide fault tolerant operation. This means that error detection and correction is usually provided at the subsystem rather than at the host CPU level. Thus, the detection and correction of data error or erasure would be processed at either the DASD or the SCU level by hardware, software or combination means. In the preferred embodiment of this invention, the array decoding and error control means is positioned at the SCU 3. This is to take advantage of the processing and buffering capacity normally associated with the SCU. However, such is not an intrinsic limitation of the method and means of the invention which could also be implemented as part of the control unit function for a multi-tracked tape drive and the like.

APL Interpreters, Compiled Code, and Logical Processing

The method and means of this invention are preferably embodied and executed either as a set of defined functions invoked and executed via an APL language interpreter, a compiled object code rendition, or as a logic circuit arrangement formed from a plurality of shift registers, rotation and logical combining networks. The use of defined functions and APL interpretive processors is well appreciated in the encoding and decoding of bit strings as described in Siegel et. al., U.S. Pat. No. 4,567,464, "Fixed Rate Constrained Channel Code Generating And Recovery Method And Means Having Spectral Nulls For Pilot Signal Insertion", issued Jan. 28, 1986. Also, APL defined functions have been translated and compiled into FORTRAN executable object code. Another related approach involves creating a stand alone run time APL formed through encapsulating a reduced version of the interpreter, auxiliary processors, and the defined functions.

APL is an interpretive programming language system in continuous commercial use since 1968. Computer science illustrations can be found in Casey et al, U.S. Pat. No. 4,181,952, issued Jan. 1, 1980. The Casey patent describes a machine-implementable method executing on an IBM System 370. Such an installation has resident an APL/360 interpreter. The counterpart APL language system is fully set out in IBM publication LY20-2678, entitled "APL/360-OS and APL/360-DOS System Manual", published in February 1975.

The method and means of this invention are variously implemented in a revised version of APL known as APL2 Release 1.2 language system, copyrighted by IBM 1992, IBM product numbers 5688-228 and 5688-229. It is also implemented in APL2 for the IBM PC Version 1.02 as described in IBM User's Guide SC33-0600-02, Third Edition, copyright IBM 1991. The former is executed in an IBM MVS operating system environment defined in Amdahl et. al., U.S. Pat. No. 3,226,689, and in publication "IBM Systems/370 Principles of Operation", A22-7000-4. The latter is executed in a Microsoft DOS 6.2 or a PC DOS operating system environment and the like.

It should be appreciated that both APL and APL2 consist of three components, namely arrays, functions, and operators. Arrays are the generalized data structures consisting of collections of numbers and text characters. The functions are processes that manipulate arrays. That is, they take arrays as arguments and produce new arrays as results. Operators are processes that manipulate functions in that they take functions as operands and produce new functions as results. Advantageously APL2, utilizes a heterogeneous array of literals in addition to numerals and otherwise extends the functions and operators of APL.

APL and APL2 are also exhaustively described in Polivka and Pakin, "APL: The Language And Its Usage", copyright 1975 by Prentice Hall Publishing Co., Englewood Cliffs, N.J., and Gilman and Rose's, "APL—An Interactive Approach", 3rd Edition, copyright 1984 by John Wiley & Sons. Pub. Inc., New York, N.Y.

The SCU, APL Processor, And Operational Context of the Invention

Figure 1B:
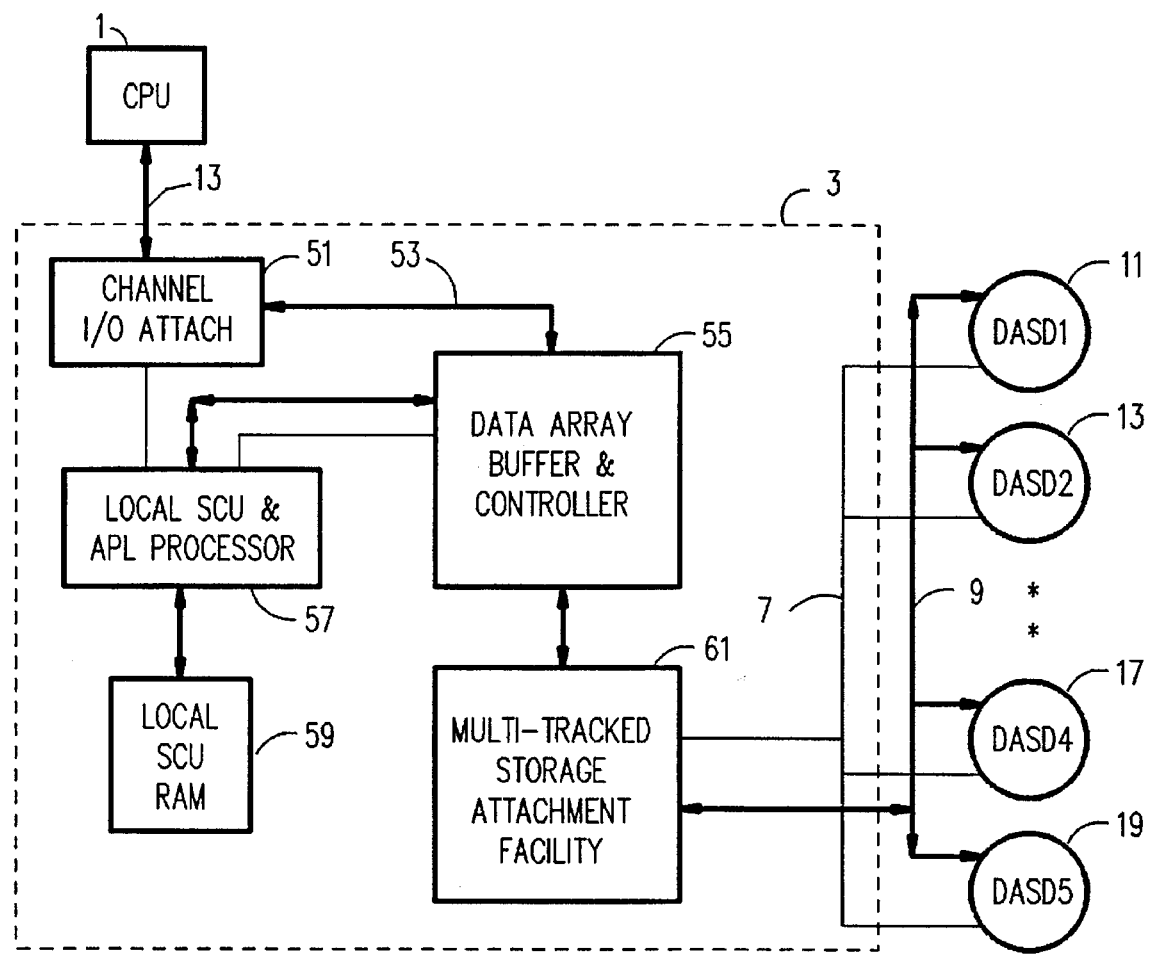
FIG. 1B shows the storage control unit portion of the storage subsystem including a data array buffer and a local APL processor for executing the method of the invention.

Referring now to FIG. 1B, there is shown the storage control unit portion 3 of the storage subsystem depicted in FIG. 1A including a data array buffer 55 and a local APL processor 57 for executing the method of the invention. In the SCU, a local random access memory (RAM) 59 coupling processor 57 and stores the APL interpreter, defined functions, and operators. The SCU further includes a channel I/O attachment logic 51 responsive to commands (CCW's) from the host CPU 1 over paths 13. Attachment 51 typically sends any CCW's received from the host to local processor 57 for interpretation. The processor, in turn, has both control and data paths to attachment 51, a data array buffer and controller 55, and facility 61. Facility 61 attaches either multi-tracked storage devices such as DASDs in an array, multi-drop line coupled DASDs, or one or more tape drives and the like.

Responsive to the CPU I sending a series of CCW's to the SCU 3, the processor 57 interprets and sends coded control signals to the attachment facility 61. This causes a path to data to be set up on the storage devices. Where the CPU is requesting data from the storage subsystem, then one or more data arrays are selectively copied from devices 11-19, passed through facility 61, and moved into data array buffer 55. At this point, processor 57 invokes the APL defined functions resident in RAM 59 using each data array located in the buffer 55 as an argument. It is at this point that each data array is evaluated as to errors and erasures using the method and means of this invention.

Multiple Parity Encoding Of A Data Array

Figure 1C:
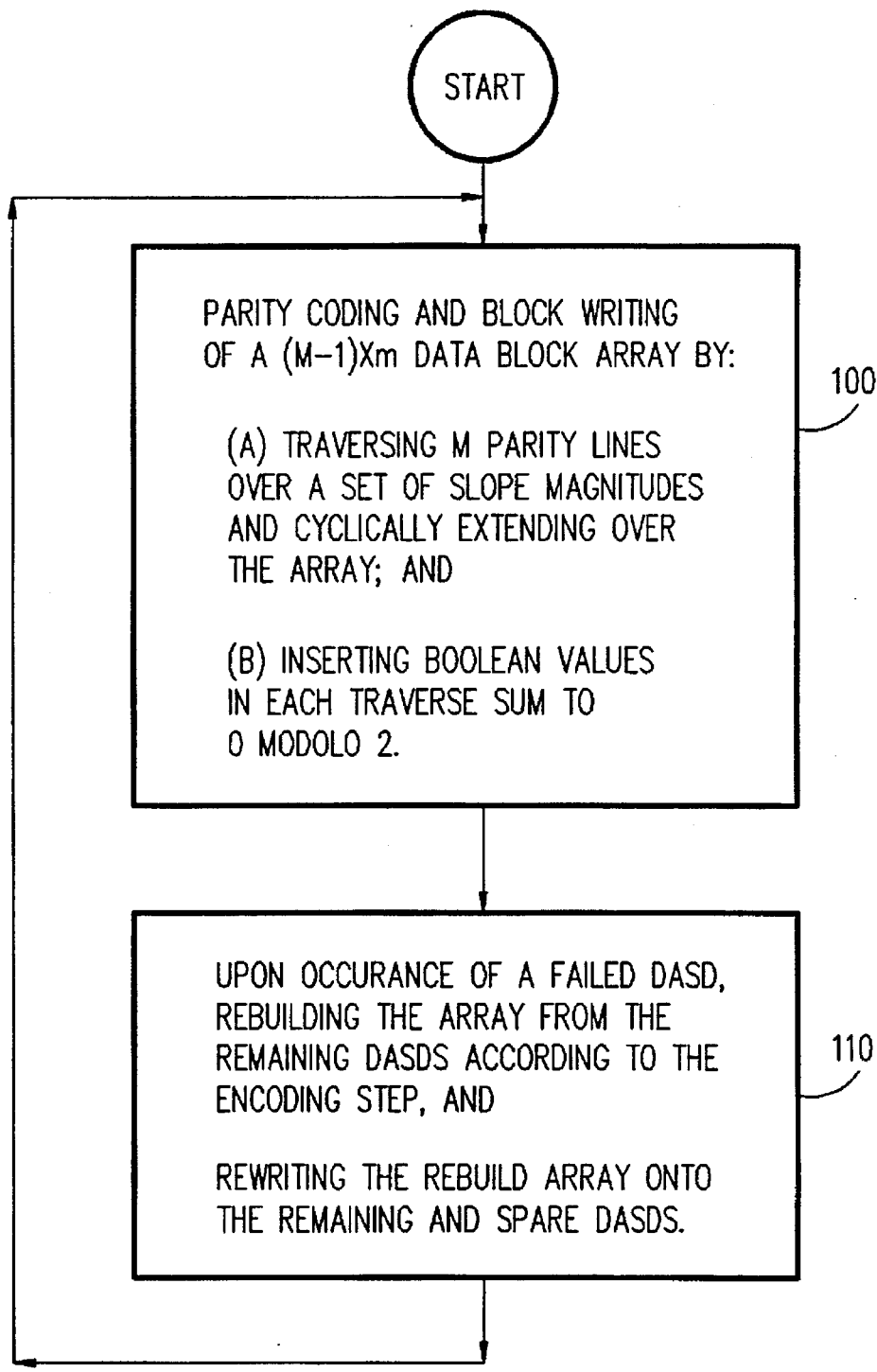
FIG. 1C depicts the flow of control of the parity coding of a data array following traverses of different slopes according to the copending Blaum '633 application.

Referring now to FIG. 1C when taken together with FIGS. 1D to 1F, there is shown a synoptic flow of control of parity encoding of a data array of 1's and 0's according to the copending Blaum '663 application. Significantly, several parity values are determined by following a counterpart traverse of slope 0, 1, or 2 and adding the binary 1's so encountered any counterpart sloped traverse modulo 2 (block 100). This is the same exclusive ORing the binary values so encountered. The parity value once determined is inserted in each traverse to ensure that the sum is 0 modulo 2 (block 100).

Upon occurrence of a failed DASD, the data array is using the remaining DASDs according to the step (block 100). The rebuilt data array is then written into the remaining and spare DASDs (block 110). The parity encoding of an n×m bit data array as described in Blaum et. al. U.S. Pat. No. 5,271,012 and the copending Blaum et. al. application U.S. Ser. No.: 08/177,633 uses maximum distance separation between encoded patterns as defined over certain polynomial rings rather than over algebraic fields. In the '012 patent, parity encoding requires the 0 modulo 2 addition of binary 1's encountered during traversal of a zig zagged wrap-around loci spanning the array. The parity encoding traversals are more elaborate in the '633 application.

(a) computing parities of an n×m data bit array by XORing the bits along traverses of slopes 0, 1, 2, . . . , R−1, extended cyclically over the data array, and assuming a "phantom" all-zero row as an m-th row of the array, resulting in R values, one for each slope, each value being an m-bit cell.

(b) substituting the result of (a) in an auxiliary row consisting of m-bit cells, and performing up to R iterations of:

(i) rotating the bits in each m-bit cell in the column, each m-bit cell rotated individually, as if the bits in each cell were on a circumference of a wheel. The amount of rotation (=cyclic shift) is equal to the location of one of the unavailable DASDs in the array, specific to each iteration.

(ii) shifting the above-calculated contents of the m-bit cells, each as one block, and each to the location of the next in line, with the first (now vacant) one being zeroed.

(iii) XORing bitwise the above-calculated contents of the auxiliary row with its contents prior to the current iteration.

Referring again to FIGS. 1D–1F, there is shown the parity encoding traverses according to the '633 application with slope values=0, 1 and 2 respectively.

Referring again to FIG. 1C, the parity encoding occurs in the data array buffer 55 at a point prior recording the data array on a DASD or tape device in the storage subsystem. As pointed out in the copending Blaum '663 application, correction of some error and erasure can be attained by repeating the encoding step on a data array copied into the array buffer from a storage device responsive to a READ access command. However, the error and erasure recovery suffers several implementation disadvantages and is therefor not the subject of this invention.

Syndrome Determination By Column Rotation And Summation According To The Invention Generally speaking, any decoding method for an array or other linear block code involves a determination as to whether the received data array, when convolved with the elements of the dual of the encoding matrix called "syndromes", yields an all zero's result. If so, then the data array is without error or erasure. Any non-zero syndrome determination means the data array includes errors and erasures. The syndrome determination as used in this code involves making copies of the data array, rotating the column vectors in the data array by predetermined amounts, and modulo 2 addition of the rotated columns. This process is repeated for each syndrome. Note, there are as many syndromes as there are array columns.

In the next paragraph, basic operators are formally defined as is the notion of syndrome. This is followed by an illustrative example.

Let $F_n$ denote the set of all binary n-tuples and let $F_1$ denote the subset of $F_n$ consisting of all n-tuples which contain 0 in the last position. For any vector $x' = (x_0, x_1, \ldots, x_{n-1})$ which is a member of the set $F_n$, let $\rho(x') = (x_{n-1}, x_0, \ldots, x_{n-2})$ be the cyclic rotation of $x'$ to the right and let $\rho_k(.)$ denote the result of applying the operator $\rho(.)$ successively k times. Also, let $\rho_0(x') = x'$ and $\rho_{-k}(.)$ connote rotation of k times to the left.

If A is any n×m binary data array of 1's and 0's, then $A = (a_0', a_1', \ldots, a_{m-1}')$ Each $a_i'$ denotes the columns, or symbols, of A. Now, for $j \geq 0$, the j-th syndrome of A is a binary vector of length n, given by $$S_j' = \sum_{i=0}^{m-1} \rho_{j \cdot i}(a_i').$$

The summation $\Sigma$ represents the componentwise vector addition modulo 2.

Suppose a data array B was copied into array buffer where:

$$B = \begin{matrix} 0 & 0 & 0 & 1 & 0 \\ 0 & 1 & 0 & 1 & 0 \\ 0 & 1 & 0 & 0 & 0 \\ 0 & 0 & 0 & 1 & 0 \\ 0 & 0 & 0 & 0 & 0 \end{matrix}$$

As may be recalled for each n×m data array, there are m syndromes $s_0, S_1, \ldots, S_{m-1}$ to be determined where each j-th syndrome is computed according to the relation:

$$S_j' = \sum_{i=0}^{m-1} \rho_{j \cdot i}(a_i')$$

This means that for each syndrome $s_j$, each of the columns i from left to right is rotated $(i-1)*j$ times or so many positions down on a column wrap around basis. The columns are then added modulo 2 to form the components of the syndrome.

Where j=0, then syndrome so would rotate each column i by $(i-1)*j$ or $(i-1)*0=0$ positions. Thus syndrome $s_0$ would appear in the rightmost column as:

$$\begin{matrix} 0 & 0 & 0 & 0 & 0 & s_0' \\ - & - & - & - & - & -- \\ 0 & 0 & 0 & 1 & 0 & 1 \\ 0 & 1 & 0 & 1 & 0 & 0 \\ 0 & 1 & 0 & 0 & 0 & 1 \\ 0 & 0 & 0 & 1 & 0 & 1 \\ 0 & 0 & 0 & 0 & 0 & 0 \end{matrix}$$

Note, that the number at the top of each column is the number of positions each column entry is moved or "rotated".

For j=1, then the rotation for each column $(i-1)*j = (i-1)*1$. Thus, for $s_1'$, entries in the respective columns 1,2,3,4,5 would be rotated by 0,1,2,3,4 positions. Diagramatically, $$\begin{matrix} 0 & 1 & 2 & 3 & 4 & & & & & & s_1' \\ - & - & - & - & - & & & & & & -- \\ 0 & 0 & 0 & 1 & 0 & & 0 & 0 & 0 & 0 & 0 \\ 0 & 1 & 0 & 1 & 0 & & 0 & 0 & 0 & 1 & 0 & 1 \\ 0 & 1 & 0 & 0 & 0 & = & 0 & 1 & 0 & 0 & 0 & 1 \\ 0 & 0 & 0 & 1 & 0 & & 0 & 1 & 0 & 1 & 0 & 0 \\ 0 & 0 & 0 & 0 & 0 & & 0 & 0 & 0 & 1 & 0 & 1 \end{matrix}$$

For j=2, then the rotation for each column $(i-1)*j=(i-1)*2$. Thus, for $s_2'$, entries in the respective coles 1,2,3,4,5 would be rotated by 0,2,4,6,8 positions such that:

$$\begin{matrix} 0 & 2 & 4 & 6 & 8 & & & & & & s_2' \\ - & - & - & - & - & & & & & & -- \\ 0 & 0 & 0 & 1 & 0 & & 0 & 0 & 0 & 0 & 0 & 0 \\ 0 & 1 & 0 & 1 & 0 & & 0 & 0 & 0 & 1 & 0 & 1 \\ 0 & 1 & 0 & 0 & 0 & = & 0 & 0 & 0 & 1 & 0 & 1 \\ 0 & 0 & 0 & 1 & 0 & & 0 & 1 & 0 & 0 & 0 & 1 \\ 0 & 0 & 0 & 0 & 0 & & 0 & 1 & 0 & 1 & 0 & 0 \end{matrix}$$

For j=3, then the rotation for each column $(i-1)*j=(i-1)*3$. Thus, for $s_3'$, entries in the respective columns 1,2,3,4,5 would be rotated by 0,3,6,9,12 positions.

$$\begin{matrix} 0 & 3 & 6 & 9 & 12 & & & & & & s_3' \\ - & - & - & - & -- & & & & & & -- \\ 0 & 0 & 0 & 1 & 0 & & 0 & 1 & 0 & 1 & 0 & 0 \\ 0 & 1 & 0 & 1 & 0 & & 0 & 0 & 0 & 0 & 0 & 0 \\ 0 & 1 & 0 & 0 & 0 & = & 0 & 0 & 0 & 1 & 0 & 1 \\ 0 & 0 & 0 & 1 & 0 & & 0 & 0 & 0 & 0 & 0 & 0 \\ 0 & 0 & 0 & 0 & 0 & & 0 & 1 & 0 & 1 & 0 & 0 \end{matrix}$$

In this example, the set of syndromes obtained from data array B are:
$S_0' = 1\ 0\ 1\ 1\ 0$
$S_1' = 0\ 1\ 1\ 0\ 1$
$S_2' = 0\ 1\ 1\ 1\ 0$
$S_3' = 0\ 0\ 1\ 0\ 0$ It should be noted that each syndrome is determined as the modulo 2 sum of suitably rotated vector columns of the data array. Since the syndromes are not equal to zero, then data array B suffers from at least one error.

Cyclic Equivalents

It should be appreciated that the decoding method and means of this invention is based on the operation of testing for cyclic equivalents between binary vectors as the latter term is used in linear algebra and coding theory. Unlike, the prior art, this method and means does not require finite field operations. The only operations required are those of cyclic rotations, bitwise XORing across columns of the array, and testing for cyclic equivalence among binary vectors.

The array code A(n,m,t) of length m with symbols of n−1 components is defined as:

A(n,m,t)={A=(a$_0$',a$_1$', . . . ,a$_{m-1}$'): a$_0$',a$_1$', . . . , a$_{m-1}$'∈F$_1$, s$_j$(A)=0 for j=0,1. . . t−1} where 0 denotes the all zero vector. Parenthetically, since the last row of each A∈A is 0, A(n,m,t) is defined over symbols of length n−1 bits. Relatedly, only the first n−1 bits of each column need be recorded in the storage subsystem. It should be recalled from the above mentioned Blaum patent and copending application that if n is a prime number and n≦n, then the code A(n,m,t) is capable of correcting up to t erased symbols. More generally, A(n,m,t) code can correct up to τ symbols in error and e erasures provided that 2Σ+e≦t.

Given two vectors a' and b' in F$_n$, they are said to be CYCLICALLY EQUIVALENT if there exists a non-negative integer k≦n−1, such that a'=ρ$_k$(b'). Cyclic equivalence between vectors a' and b' is denoted a'≡=b' and the absence of cyclic equivalence is denoted by a'<16 >b'.

Cyclic equivalence is premised on two observations. First, given a set of intermediate vectors u$_0$', u$_1$', . . . ,u$_{n-1}$' defined by u$_i$':=¬b$_{n-i}$⊕ρ$_i$(a')=¬b$_{n-i}$⊕a$_0$',¬b$_{n-i}$⊕a$_1$' etc for i=0,1, . . . , n−1 where ¬b$_{n-i}$ is the logical complement of b$_{n-1}$. This is construed as a scalar coefficient being XOR'ed with each element of a vector.

If u'=AND of u$_i$' over i=0 to n−1 and represents the componentwise logical AND of these vectors, then the k-th entry of u' is the output of an n-input AND gate whose inputs are the k-th entries of u$_0$',u$_1$', . . . ,u$_{n-1}$'. This is summed up in the proposition:

The k-th entry of intermediate vector u' is NON-ZERO if and only if a'=ρ$_k$(b).

The second observation is that:

If n is any prime number and if a' and b' are two vectors in F$_n$ over the alphabet {0,1}, there exists at most one non-negative integer k≦n−1 such that a'=ρ$_k$(b').

As an example let a':=0 1 1 0 1 and b':=1 0 1 0 1. It follows that a'=ρ$_2$(b). Now calculating u$_0$',u$_1$', . . . ,u$_4$' according to the relation u$_i$':=¬b$_{n-i}$⊕ρ$_i$(a'):

u$_0$'=¬b$_0$⊕ρ$_0$(a')=0 1 1 0 1
u$_1$'=¬b$_4$⊕ρ$_1$(a')=1 0 1 1 0
u$_2$'=¬b$_3$⊕ρ$_2$(a')=1 0 1 0 0
u$_3$'=¬b$_2$⊕ρ$_3$(a')=1 0 1 0 1
u$_4$'=¬b$_1$⊕ρ$_4$(a')=0 0 1 0 1
u'=u$_0$'∧u$_1$'∧u$_2$'∧u$_3$'∧u$_4$'=0 0 1 0 0

This means that the vector u' contains a single non-zero entry at position K=2.

Correcting Two Errors Utilizing Cyclic Equivalence Testing

Figure 1G:
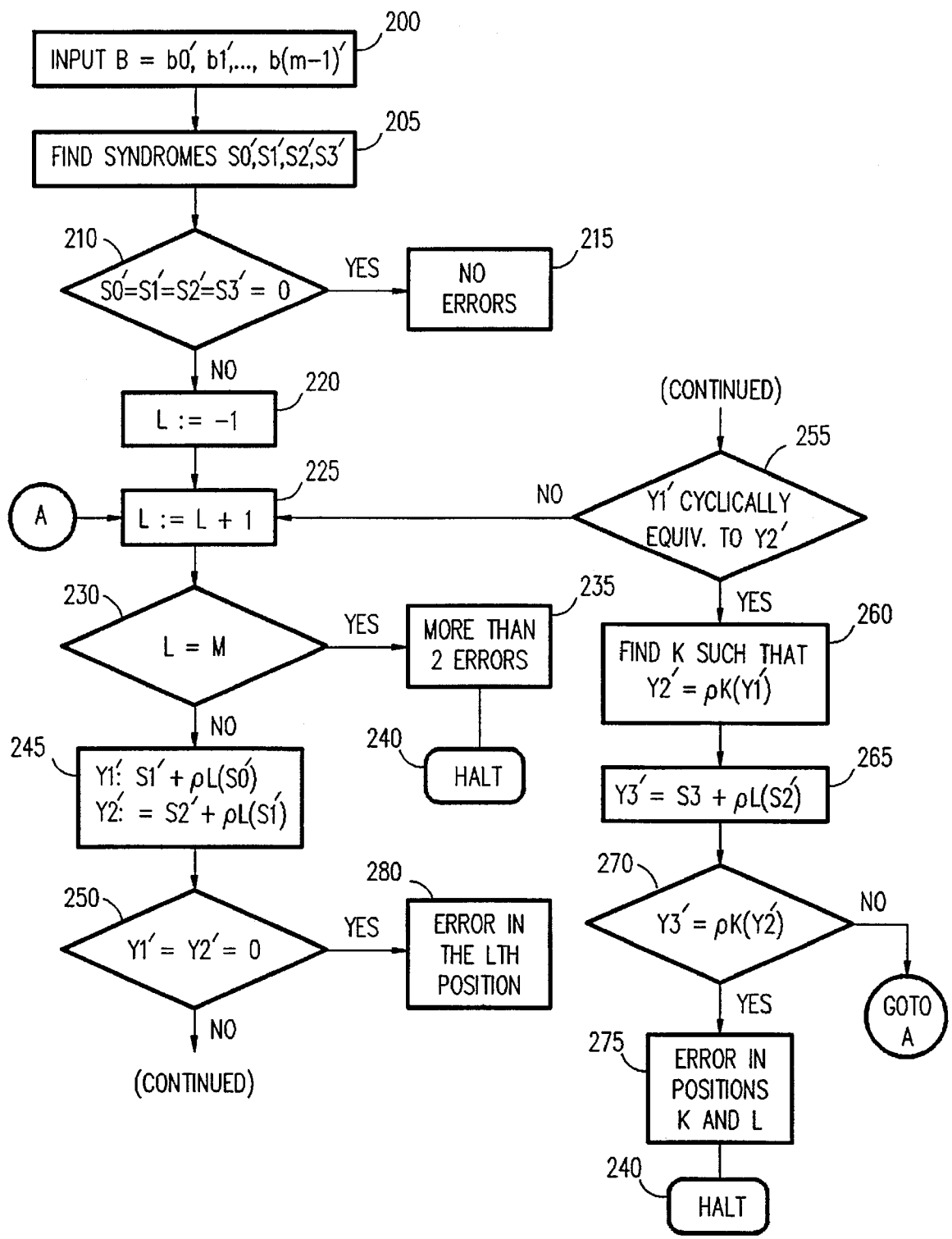
FIG. 1G shows a flow of control for correcting up to two errors in an n×m array of data bits involving the testing of cyclic equivalents according to the invention.

Referring now to FIG. 1G, there is shown a flow of control for correcting up to two errors in an n×m array of data bits involving the testing of cyclic equivalents according to the invention. More particularly, given a data array which has been parity encoded by a A(n,m,4) code, the following method should correct τ=2 symbols in error and e symbol erasures. This means that the code should be A(n, m,4+e). Note also, that n is a prime number and m≦n.

Given a n×m array where A=(a$_0$',a$_1$', . . . ,a$_{m-1}$') be a codeword in A(n,m,4) that was originally recorded and let B=(b$_0$',b$_1$',b$_{m-1}$') (block 200) be the n×m array copied from the storage device into the array buffer 55.

For j=0,1,2,3 let s$_j$'=s$_j$'(B)=Σ$_{i=0}^{m-1}$ρ$_{ji}$(b$_i$')

The steps of the method as also depicted in FIG. 1G, ascertain errors at locations L and K provided that no more than two symbol errors are present in the copied array. This figure discloses two processing loops or paths. One path involves initializing and incrementing a iterative loop variable L incremented during each iteration. This identifies the array column location of any single error when a single error condition has occurred. The second path involves locating the column containing a second error given that a first error has been detected.

The steps comprise:

(0) Ascertain the syndromes s$_0$', . . . ,s$_3$'(block 205).
(1) If s$_0$=s$_1$'=s$_2$'=s$_3$'=0, then declare that no errors have occurred and halt (blocks 210 and 215). Otherwise, initialize a location variable L:=1 (block 220).
(2) Set L:=L+1 (block 225). If L=m, then declare that more than two errors have occurred and halt (blocks 230, 235 and 240).
(3) Compute intermediate vectors y$_1$' and y$_2$' (block 245) according to the relations:
y$_1$'=s$_1$'+ρ$_L$(s$_0$'), y$_2$'=s$_2$'+ρ$_L$(s$_1$'),
(4) If y$_1$'=y$_2$'=0, then declare a single error at location L and halt (blocks 250 and 280).
(5) If y$_1$' is NOT cyclically equivalent to y$_2$' (block 255) i.e. y$_1$<≢>y$_2$', then go to step (2). Otherwise, find a location K (blocks 260) such that
y$_2$'=ρ$_K$(y$_1$') (set y$_2$' to be equal to the K rotation of y$_1$' vector).
(6) Calculate intermediate vector y$_3$'=s$_3$'+ρ$_L$(s$_2$') (block 265). If the y$_3$' vector is not equal to the K rotation of the y$_2$' vector determined in step (5) i.e. y$_3$'≠ρ$_K$(y$_2$'), then go to step (2). Otherwise declare that two errors have occurred at positions K and L and halt (block 270, 275 and 240).

Correcting Two Errors—An Illustrative Example

Assume that a data array was parity encoded according to a A(n,m,t)=A(5,5,4) code and that the array B copied from the storage device into buffer 55 is given by $$B = \begin{matrix} 0 & 0 & 0 & 1 & 0 \\ 0 & 1 & 0 & 1 & 0 \\ 0 & 1 & 0 & 0 & 0 \\ 0 & 0 & 0 & 1 & 0 \\ 0 & 0 & 0 & 0 & 0 \end{matrix}$$

Calculating the syndromes per $$S_j = \sum_{i=0}^{m-1} \rho_{j*i}(a_i)$$

s$_0$'=(1 0 1 1 0)
s$_1$'=(0 1 1 0 1)
s$_2$'=(0 1 1 1 0)
s$_3$'=(0 0 1 0 0)

From step (2) of the method L=0 and per step (3)
y$_1$'=s$_1$'+ρ$_0$(s$_0$')=(0 1 1 0 1)+(1 0 1 1 0)=(1 1 0 1 1)
y$_2$'=s$_2$'+ρ$_0$(s$_1$')=(0 1 1 1 0)+(0 1 1 0 1)=(0 0 0 1 1)

Clearly, y$_2$' is NOT cyclically equivalent to y$_1$'. That is, there is no value of y$_1$' in rotation which is the same as y$_2$'. As stated before, two vectors a' and b' in F$_n$ are said to be CYCLICALLY EQUIVALENT only if there exists a non-negative integer k≦n−1, such that a'=ρ$_k$(b').

Thus, the method returns to step (2) where L=1.
Given that L=1, then
y$_1$'=s$_1$'+ρ$_1$(s$_0$')=(0 1 1 0 1)+(0 1 0 1 1)=(0 0 1 1 0)
y$_2$'=s$_2$'+ρ$_1$(s$_1$')=(0 1 1 1 0)+(1 0 1 1 0)=(1 1 0 0 0) Note that ρ$_1$(s$_0$') and ρ$_1$(s$_1$') are the vectors s$_0$'and s$_1$' rotated one position to the right.

It follows from this that $y_2'$ is the same as $\rho_3(y_1')$ where $y_1'$ is rotated to the right by three places $y_2'=\rho_3(y_1')=\rho_3(0\ 0\ 1\ 1\ 0)=1\ 1\ 0\ 0\ 0$. Also, $y_3'=s_3'+\rho_1(s_2')=(0\ 0\ 1\ 0\ 0)+(0\ 0\ 1\ 1\ 1)=(0\ 0\ 0\ 1\ 1)=\rho_3(y_2')$ The method correctly determines that errors have occurred in positions 1 and 3. These errors are then corrected using the erasure decoding methods described in the copending Blaum '633 application.

The APL Embodiment

Referring now to FIGS. 2A–2B, 3, and 4, there is disclosed a flow of control expressed as APL defined functions for the detection and correction of multiple erasures and errors in a parity coded data array using cyclic equivalents embodying the precepts depicted in FIG. 1F. More particularly, FIGS. 2A and 2B set out the 76 step major APL defined function "DEC2" for correcting up to two errors in a parity coded data array; FIG. 3 shows two defined functions "SYN" and "GO1" called by DEC2 involved in syndrome computation; and FIG. 4 depicting a prior art algorithm "SHILOAH" for finding cyclic equivalence.

Referring again to FIGS. 2A–2B and 3, the APL defined function "DEC2" computes syndromes in statements [22]–[24] by way of a function call to the defined function "SYN" in FIG. 3. In the SYN defined function, for any given syndrome determination, the steps [4]–[6] rotate each column vector by the predetermined displacement using the dyadic rotate operator $\phi$ while step [7] forms the modulo 2 sum of the column vectors.

It should also be noted in the DEC2 defined function that statements [42]–[45] form the intermediate vectors used in the determination of a single error and its location or in detection of two or more errors.

The following illustrative example comprises print screens taken during the execution of the defined functions expressed in FIGS. 2A–2B and 3 on APL2/PC Version 1.02 in an IBM Intel 80486 microprocessor based personal computer running under a Microsoft DOS 6.2 Operating System. The same defined functions have also been run on an IBM 3033 on APL2 Release 1.2 running under an MVS operating system with the same results.

TABLE 1

First APL Screen Of Test Data Array

| Line | 19490 | Column 1 | APL2/PC | Input |
|---|---|---|---|---|
| | )CLEAR | | | |
| CLEAR | WS | | | |
| | )LOAD ARRAYS | | | |
| SAVED | 1994-07-03 15.06.36 ARRAYS | | | |
| | )FNS | | | |
| DEC2 | EDIT | EDIT2 GO1 SHILOAH SYN TRACEALL | | |
| | )VARS | | | |
| | B | | | |
| B | | | | |
| 1 0 1 1 1 0 0 | | | | |
| 1 1 1 0 1 0 0 | | | | |
| 0 0 1 0 1 0 0 | | | | |
| 0 0 1 0 0 0 1 | | | | |
| 0 1 1 0 0 0 0 | | | | |
| 1 0 1 0 0 0 0 | | | | |
| 0 0 0 0 0 0 0 | | | | |

It is now desired to introduce 2 errors in the second row of array B. This is done by first equating array C to array B and then modifying array C with the error. The error can be seen in the display of the modified C array.

TABLE 2

Second APL Screen Introducing Error Into Test Data Array

| Line 19546 | Column 1 | APL2/PC |
|---|---|---|
| Input | | |
| B | | |
| 1 0 1 1 1 0 0 | | |
| 1 1 1 0 1 0 0 | | |
| 0 0 1 0 1 0 0 | | |
| 0 0 1 0 0 0 1 | | |
| 0 1 1 0 0 0 0 | | |
| 1 0 1 0 0 0 0 | | |
| 0 0 0 0 0 0 0 | | |
| C<--B | | |
| C[2;]<--1 0 1 1 1 0 0 | | |
| C | | |
| 1 0 1 1 1 0 0 | | |
| 1 0 1 1 1 0 0 | | |
| 0 0 1 0 1 0 0 | | |
| 0 0 1 0 0 0 1 | | |
| 0 1 1 0 0 0 0 | | |
| 1 0 1 0 0 0 0 | | |
| 0 0 0 0 0 0 0 | | |

Next a tracing sequence for the execution of the DEC2 defined function is inserted. The trace is a standard software debugging tool of APL language systems and produces a list of executed instructions, modified arguments, and resultants.

TABLE 3

Third APL Screen Insertion Of Trace Command

| Line 22468 | Column 1 | APL2/PC | Input |
|---|---|---|---|
| TΔDEC2<--15 21 22 23 24 29 30 31 32 36 67 69 70 73 | | | |

Referring now to FIGS. 2A–2B and 3, the trace of the APL defined function DEC2 with the modified array C follows:

TABLE 4

Fourth APL Screen Selective Trace of "DEC2" Defined Function With Data Array Having Two Errors

| Line 22500 | Column1 | APL2/PC | Input |
|---|---|---|---|
| DEC2[15] | | | |
| 1 0 1 1 1 0 0 | | | |
| 1 0 1 1 1 0 0 | | | |
| 0 0 1 0 1 0 0 | | | |
| 0 0 1 0 0 0 1 | | | |
| 0 1 1 0 0 0 0 | | | |
| 0 0 0 0 0 0 0 | | | |
| DEC2[21] 0 0 0 0 0 0 0 | | | |
| DEC2[22] 0 0 1 0 1 0 0 | | | |
| DEC2[23] 1 0 0 1 0 0 0 | | | |
| DEC2[24] 0 0 0 1 1 0 0 | | | |
| DEC2[29] 6 | | | |
| DEC2[30] 0 0 1 0 1 0 0 | | | |
| DEC2[31] 1 0 0 1 0 0 0 | | | |
| DEC2[32] 0 0 0 1 1 0 0 | | | |
| DEC2[36] -->39 | | | |
| DEC2[67] | | | |
| 1 0 1 1 1 0 0 | | | |
| 1 1 1 0 1 0 0 | | | |
| 0 0 1 0 1 0 0 | | | |
| 0 0 1 0 0 0 1 | | | |
| 0 1 1 0 0 0 0 | | | |
| 1 0 1 1 1 0 0 | | | |
| 0 0 0 0 0 0 0 | | | |

The resultant of DEC2 [67] shows the corrected array. Next, the data array C is further modified to include three errors. Predictably, this exceeds the power of the defined function and an error message "Uncorrectable Error" should appear as associated with DEC2 [73].

TABLE 5

Fifth APL Screen Showing Trace of Defined Function "DEC2" With Data Array Having Three Errors.

```
Line 23456    Column 1         APL2/PC    Input
    C[3;]<--1 1 0 0 1 0 0
    C
    1 0 1 1 1 0 0
    1 0 1 1 1 0 0
    1 1 0 0 1 0 0
    0 0 1 0 0 0 1
    0 1 1 0 0 0 0
    1 0 1 0 0 0 0
    0 0 0 0 0 0 0
         DEC2 C
DEC2[15]
    1 0 1 1 1 0 0
    1 0 1 1 1 0 0
    1 1 0 0 1 0 0
    0 0 1 0 0 0 1
    0 1 1 0 0 0 0
    1 0 1 0 0 0 0
    0 0 0 0 0 0 0
DEC2[21] 0 0 1 0 0 0 0
DEC2[22] 0 0 1 1 1 0 0
DEC2[23] 0 0 1 0 1 0 1
DEC2[24] 0 1 1 0 0 1 0
DEC2[29] 6
DEC2[30] 0 1 1 1 1 0 0
DEC2[31] 1 0 1 0 1 0 1
DEC2[32] 0 1 1 0 0 1 1
DEC2[36] -->39
DEC2[73] Uncorrectable Error.
```

Correcting Three Errors

The method for detecting and correcting three symbol errors with a A(n,m,6) array code is an extension of the method described for detecting and correcting two symbols in error.

Given a n×m array where $A=(a_0', a_1', \ldots, a_{m-1}')$ be a codeword in A(n,m,6) . . . that was originally recorded and let $B=(b_0, b_1', \ldots, b_{m-1}')$ be the n×m array copied from the storage device into the array buffer 55.

For j=0,1,2,3,4,5 let $s_j'=s_j'(B)=\Sigma_{i=0}^{m-1}\rho_{ji}(b_i')$

The steps of the method as also depicted in FIG. 1F ascertain errors at locations L and K provided that no more than two symbol errors are present in the copied array. The steps comprise:

(0) Ascertain the syndromes $s_0', \ldots, s_5'$.

(1) If $s_0'=s_1'=s_2'=s_3'=s_4'=s_5'=0$, then declare that no errors have occurred and halt. Otherwise, initialize a location variable L:=1.

(2) Set L:=L+1. If L=m, then declare that more than three errors have occurred and halt.

(3) Compute intermediate vectors $z_i'$ and $z_{i+}'$ ($z_1, z_2', \ldots, z_5'$) to the relations:

$z_1'=s_1'+\rho_L(s_0')$
$z_2'=s_2'+\rho_L(s_1')$
$z_3'=s_3'+\rho_L(s_2')$
$z_4'=s_4'+\rho_L(s_3')$
$z_5'=s_5'+\rho_L(s_4')$ (4) If $z_1'=z_2'=\ldots z_5'=0$, then declare a single error at location L and halt. Otherwise, set J:=-1.

(5) If $z_1'\neq z_{i+1}'$, then set J:=J+1 and goto step (2). Otherwise compute additional vectors
$y_1'=z_2'+\rho_J(z_1')$
$y_2'=z_3'+\rho_J(z_2')$ (6) If $y_1'=y_2'=0$, then compute $y_3'=z_4'+\rho_J(z_3')$. If $y_3'=0$, declare two errors at positions J and L and halt.

(7) If $y_2'<\neq>y_1'$, go to step (5). Otherwise, find a location K such that $y_2'=\rho_K(y_1')$ (8) If $y_3'=z_4'+\rho_J(z_3')\neq\rho_K(y_2')$, then go to step (5).

(9) If $y_4'=z_5'+\rho_J(z_4')\neq\rho_K(y_3')$, then go to step (5).

(10) Otherwise, declare that three errors have occurred at positions J, K and L and halt.

Extensions

As may be recalled an erasure is an error whose location is a priori known to the decoder. Given syndrome values and the erasure locations, then erasure free syndrome values can be determined. This means that the decoder having erasure free syndromes at its input will produce error locations at its output. Once the error locations are known, then an erasure decoding method such as that described in the copending Blaum '633 application can be applied to compute the values of all the errors and erasures.

These and other extensions of the invention may be made without departing from the spirit and scope thereof as recited in the appended claims.

We claim:

1. In a computer system comprising a central processing unit and a storage medium, a method for detecting and locating up to two symbols in error or erasures in an n×mA (n,m,4) parity coded bit array where n is a prime number, m≦n comprising the steps of:

(a) rotating, using said computer system, m column vectors in said n×m A(n,m,4) parity coded bit array by predetermined amounts;

(b) forming, using said computer system, m modulo 2 summed syndromes from said rotated m column vectors, and in a presence of any error, deriving at least one non-zero syndrome;

(c) computing, using said computer system, first, second, and third test vectors, each test vector being a modulo 2 sum of a unique selected syndrome and a unique selected rotated syndrome; and (d) initializing, using said computer system, a tracking variable L and incrementing L for each repetition of step (d) and:

(1) either providing signal indication of exactly one error at a column location defined by L in a presence of first and second null test vectors, (2) providing signal indication of exactly two errors and said two errors' column locations in a presence of the second test vector, said second test vector being equivalent of the first test vector rotated by L positions and the third test vector being equivalent of the second test vector rotated by K positions, L<K, (3) repeating steps (d) in an absence of cyclic equivalence among the test vectors, or (4) providing signal indication of more than two errors either in a presence of at least two zero test vectors or when L=m.

2. In a computer system comprising a central processing unit and a storage medium, a method for locating up to two symbols in error or two columns in error in a n×m parity coded bit data array, m≦n, n being prime, the method comprising the steps of:

(a) forming, using said computer system, a plurality of syndromes from predetermined cyclic rotations and modulo 2 addition across the data array columns for each syndrome;

(b) in an event of at least one non-zero syndrome, initializing, using said computer system, at least one tracking variable L and iteratively:

(1) incrementing, using said computer system, said tracking variable L by a predetermined amount, (2) forming, using said computer system, first, second, and third test vectors each as a modulo 2 sum of a different selected syndrome and a selected rotated syndrome; and (3) either:

providing signal indication of exactly one error at column location L≦(m−1) when the first and second test vectors are zero, providing signal indication of exactly two errors at column locations L and L≦K≦(m−1) where the second and third test vectors are respective Kth rotations of the first and second test vectors, repeating step (b) where (when) the first and second test vectors are not L-th rotations of each other or when the second and third test vectors are not the K-th rotations of each other, or providing signal indication of more than two errors if the incremented value L=m.

3. The method according to claim 2, wherein said method further comprises the step of:

(c) responsive to an indication of exactly one or two errors, encoding, using said computer system, said n×m parity coded bit data array by (1) traversing m parity lines projected onto said n×m parity coded bit data array for each one of a set of slopes consisting of slope magnitudes 0, 1, 2, and 3, and extending cyclically over said n×m parity coded bit data array; and (2) inserting Boolean values into the n×m parity coded bit data array during each traverse such that logically combined (XORed) values of the data encountered over each of the traverses sum to zero modulo 2 (even parity), said n×m parity coded bit data array being fully encoded in multiple parity line traverses.

4. The method according to claim 2, wherein step (a) includes forming, using said computer system, four syndromes and further wherein each i-th column of each syndrome j≦m being rotated (i−1)*j bit positions relative to a first array column in a predetermined wrap-around direction, each syndrome j≦m being the modulo 2 bitwise sum across the rotated array columns.

5. A computer system having at least one multi-tracked storage device, means for recording an n×m coded bit array across counterpart tracks of said storage device, buffer means, and insane for copying selected ones of said recorded n×m coded bit arrays from said device into said buffer means where m≦n, n being prime, said computer system further comprises:

means for determining each of j≦m syndromes $s_j$ from the n×m coded bit array in said buffer means in which $$s_j' = \sum_{i=0}^{m-1} \rho_{j*i}(a_i')$$

where $\rho_{j*i}$ is a column vector rotational operator, $a_i'$ are columns of said n×m coded bit array; and means responsive to at least one non-zero syndrome $s_j$ for initializing at least one tracking variable L and iteratively:

(1) incrementing said tracking variable L by a predetermined amount, (2) forming first $y_1'$, second $y_2'$, and third $y_3'$ test vectors from the syndromes $s_j$ such that:
$y_1'=s_1'+\rho_L(s_0')$, $y_2'=s_2'+\rho_L(s_1')$,
$y_3'=s_3'+\rho_L(s_2')$, and (3) either providing signal indication of exactly one error at column location L≦(m−1) when the $y_1'=y_2'=0$, providing signal indication of exactly two errors at column locations L and L≦K≦(m−1) when $y_2'=\rho_K(y_1')$ and $y_3'=\rho_K(y_2')$, repeating iteratively (1) through (3) when $y_2'\neq\rho_K(y_1')$, or providing signal indication of more than two errors if the incremented value L=m.

6. In a computer system comprising a central processing unit and a storage medium, a method for detecting and correcting errors and erasures in an n×m A(n,m,4) parity coded data array, comprising the steps of:

(a) deriving, using said computer system, a plurality of syndromes from the parity coded data array, at least one non-zero syndrome being indicative of either error or erasure;

(b) forming, using said computer system, first, second, and third test vectors from the syndromes, each test vector being a sum of a unique syndrome and a unique selected rotated syndrome;

(c) initializing, using said computer system, a tracking variable L and incrementing L for each repetition of step (c) and:

(1) providing signal indicating of exactly a single error at column location L where all the test vectors are null;

(2) providing signal indication of exactly two errors when said two errors' column locations in the presence of the second test vector being equivalent of the first test vector rotated by L positions and the third test vector being equivalent of the second test vector rotated by K positions, L<K, (3) repeating step (c) in an absence of cyclic equivalence among the test vectors, or (4) providing signal indication of more than two errors either in a presence of at least two zero test vectors or when L=m; and (d) correcting, using said computer system, any array bits in error by parity encoding said array according to the A(n,m,4) code and the provided signal indications.

7. In a computer system comprising a central processing unit and a storage medium, a method for detecting and locating up to three symbols or three columns in error in an n×m A(n,m,6) parity encoded data bit array, n being a prime number and m≦n, comprising the steps of:

(a) deriving, using said computer system, six syndromes from the n×m A(n,m,6) parity encoded data bit array, a presence of at least one non-zero syndrome being indicative of either error or erasure;

(b) forming, using said computer system, first through fifth test vectors from the syndromes, each first through fifth test vector being a sum of a unique syndrome and a unique rotated syndrome, and forming a sixth through ninth test vectors, each sixth through ninth test vectors being the sum of a unique one of the first through fifth test vectors and a unique rotated one of the first through fifth test vectors;

(c) initializing, using said computer system, a first L and a second tracking variable J and incrementing L and J for each repetition of step (c) and:

(1) providing signal indicating of exactly a single error at a column location L where the first through fifth test vectors are null;

(2) providing signal indication of exactly two errors and said two errors' column locations L and J where the sixth and seventh test vectors are null;

(3) providing signal indication of exactly three errors in the presence of the eighth test vector being equivalent of the seventh test vector rotated by K positions and the ninth test vector being equivalent of the eighth test vector rotated by K positions, L<J<K;

(4) repeating step (c) in an absence of cyclic equivalence among the sixth through ninth test vectors, or (5) providing signal indication of more than three errors either when at least three of the sixth through ninth test vectors are null or when L=m.

8. The method according to claim 7, wherein the method further includes the step of:

(d) correcting, using said computer system, any array bits in error by parity encoding said parity encoded data bit array according to the A(n,m,6) code and the provided signal indications.

9. In a computer system having at least one multi-tracked storage device, means for encoding and recording m×n data bit arrays on counterpart tracks of said storage device, said m×n data bit arrays being parity encoded with a A(n,m,4) code, m≦n, n being a prime number, means for accessing, means for copying into a buffer means, and means for decoding an array recorded on said multi-tracked storage device, said decoding means comprising:

means for deriving a plurality of syndromes from the array, at least one non-zero syndrome being indicative of either error or erasure;

means for forming first, second, and third test vectors from the plurality of syndromes, each test vector being a sum of a unique syndrome and a unique selected rotated syndrome;

means for iteratively evaluating the either error or erasure condition of the array by initializing a tracking variable L and incrementing L for each iteration and further including means for either causing another iteration in an absence of cyclic equivalence among the test vectors or providing mutually exclusive signal indication of:

(1) exactly a single error at a column location L where all the test vectors are null, (2) two errors and said two errors' column locations in a presence of the second test vector being equivalent of the first test vector rotated by L positions and the third test vector being equivalent of the second test vector rotated by K positions, L<K, (3) providing signal indication of more than two errors either in a presence of at least two zero test vectors or where L=m; and means for correcting any array bits in error by parity encoding said array according to the A(n,m,4) code and the provided signal indications.

* * * * *